(12) United States Patent
Masuda et al.

(10) Patent No.: US 8,963,234 B2
(45) Date of Patent: Feb. 24, 2015

(54) SEMICONDUCTOR DEVICE

(71) Applicant: Sumitomo Electric Industries, Ltd., Osaka-shi (JP)

(72) Inventors: Takeyoshi Masuda, Osaka (JP); Toru Hiyoshi, Osaka (JP); Keiji Wada, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 33 days.

(21) Appl. No.: 13/863,143

(22) Filed: Apr. 15, 2013

(65) Prior Publication Data

US 2013/0307061 A1 Nov. 21, 2013

Related U.S. Application Data

(60) Provisional application No. 61/649,080, filed on May 18, 2012.

(30) Foreign Application Priority Data

May 18, 2012 (JP) ................................. 2012-114127

(51) Int. Cl.
*H01L 29/78* (2006.01)
*H01L 29/423* (2006.01)
(Continued)

(52) U.S. Cl.
CPC ........ *H01L 29/7827* (2013.01); *H01L 29/4236* (2013.01); *H01L 29/7813* (2013.01);
(Continued)

(58) Field of Classification Search
USPC ............................. 257/330, 77, 103, 256, 347
See application file for complete search history.

(56) References Cited

U.S. PATENT DOCUMENTS

| 5,338,945 A | 8/1994 | Baliga et al. |
| 2005/0233539 A1 | 10/2005 | Takeuchi et al. |

(Continued)

FOREIGN PATENT DOCUMENTS

| JP | 2000-509559 A | 7/2000 |
| JP | 2001-102576 A | 4/2001 |

(Continued)

OTHER PUBLICATIONS

Office Action in U.S. Appl. No. 13/863,178, dated Mar. 4, 2014.

(Continued)

*Primary Examiner* — Chuong A Luu
*Assistant Examiner* — Rodolfo Fortich
(74) *Attorney, Agent, or Firm* — Venable LLP; Michael A. Sartori; Trent B. Ostler

(57) ABSTRACT

The substrate is made of a compound semiconductor, and has a recess, which opens at one main surface and has side wall surfaces when viewed in a cross section along a thickness direction. The gate insulating film is disposed on and in contact with each of the side wall surfaces. The substrate includes a source region having first conductivity type and disposed to be exposed at the side wall surface; and a body region having second conductivity type and disposed in contact with the source region at a side opposite to the one main surface so as to be exposed at the side wall surface, when viewed from the source region. The recess has a closed shape when viewed in a plan view. The side wall surfaces provide an outwardly projecting shape in every direction when viewed from an arbitrary location in the recess.

5 Claims, 11 Drawing Sheets

(51) Int. Cl.
    *H01L 29/417*    (2006.01)
    *H01L 29/04*     (2006.01)
    *H01L 29/06*     (2006.01)
    *H01L 29/16*     (2006.01)

(52) U.S. Cl.
    CPC ....... *H01L29/41766* (2013.01); *H01L 29/4238* (2013.01); *H01L 29/045* (2013.01); *H01L 29/0696* (2013.01); *H01L 29/1608* (2013.01)
    USPC .......... 257/330; 438/186; 438/286; 438/700; 438/478; 438/471

(56)             References Cited

U.S. PATENT DOCUMENTS

2007/0015333  A1*   1/2007   Kishimoto et al. ........... 438/259
2012/0309195  A1   12/2012   Masuda

FOREIGN PATENT DOCUMENTS

| JP | 2005-328013 | A  | 11/2005 |
| JP | 2006-351744 | A  | 12/2006 |
| JP | 2007-165657 | A  | 6/2007  |
| JP | 2007-258465 | A  | 10/2007 |
| JP | 2010-040564 | A  | 2/2010  |
| WO | WO-97/47045 | A1 | 12/1997 |
| WO | WO-2012/017958 | A1 | 2/2012 |

OTHER PUBLICATIONS

Masuda et al., U.S. Appl. No. 13/863,178, "Semiconductor Device," Filed Apr. 15, 2013.
International Search Report and Written Opinion in International Application No. PCT/JP2013/060469 dated Jul. 9, 2013.
International Search Report and Written Opinion in International Application No. PCT/JP2013/060471 dated Jul. 9, 2013.

* cited by examiner (A)

(B)

(A)

(B)

(A)

(B)

SEMICONDUCTOR DEVICE

BACKGROUND OF THE INVENTION

1. Field of the Invention

The present invention relates to a semiconductor device, more particularly, a semiconductor device allowing for improved breakdown voltage.

2. Description of the Background Art

In recent years, in order to achieve high breakdown voltage, low loss, and the like in a semiconductor device, silicon carbide has begun to be adopted as a material for the semiconductor device. Silicon carbide is a wide band gap semiconductor having a band gap larger than that of silicon, which has been conventionally widely used as a material for semiconductor devices. Hence, by adopting silicon carbide as a material for a semiconductor device, the semiconductor device can have a high breakdown voltage, reduced on-resistance, and the like.

An exemplary semiconductor device employing silicon carbide as its material is a MOSFET (Metal Oxide Semiconductor Field Effect Transistor) or the like. The MOSFET is a semiconductor device that controls existence/non-existence of an inversion layer in a channel region in accordance with a predetermined threshold voltage so as to conduct and interrupt a current. For example, Japanese Patent Laying-Open No. 2005-328013 describes a trench gate type MOSFET in which a channel region is formed along a trench wall surface.

SUMMARY OF THE INVENTION

However, with the MOSFET described in Japanese Patent Laying-Open No. 2005-328013, it is difficult to secure sufficient breakdown voltage.

The present invention has been made in view of the foregoing problem, and has its object to provide a semiconductor device allowing for improved breakdown voltage.

The inventors have diligently studied a relation between a shape of a mesa and electric field intensity in a trench gate type MOSFET. The mesa includes a source region of n type, a body region of p type, and a drift region of n type. As a result, the inventors have obtained the following knowledge and arrived at the present invention. Specifically, electric field is concentrated on a vicinity of a joining portion between the body region of p type and the drift region of n type at a boundary portion between two adjacent side surfaces of the mesa (in other words, two adjacent ones of side wall surfaces that constitute the gate trench). In particular, when the two side surfaces of the mesa form an angle smaller than 180°, electric field intensity at the boundary portion between the two adjacent side surfaces becomes higher than that within a side surface of the mesa.

Accordingly, a semiconductor device according to the present invention includes a substrate, a gate insulating film, and a gate electrode. The substrate is made of a compound semiconductor and has a recess, which opens at one main surface thereof and has side wall surfaces when viewed in a cross section along a thickness direction. The gate insulating film is disposed on and in contact with each of the side wall surfaces. The gate electrode is disposed on and in contact with the gate insulating film. The substrate includes: a source region having first conductivity type and disposed to be exposed at the side wall surface; and a body region having second conductivity type and disposed in contact with the source region at a side opposite to the one main surface so as to be exposed at the side wall surface, when viewed from the source region. The recess has a closed shape when viewed in a plan view. The side wall surfaces provide an outwardly projecting shape in every direction when viewed from an arbitrary location in the recess.

According to the semiconductor device in the present invention, the recess has a closed shape when viewed in a plan view, and when viewed from the arbitrary location in the recess, the side wall surfaces provide an outwardly projecting shape in every direction. Accordingly, an angle between two adjacent ones of the side wall surfaces of the recess becomes larger than 180°. Thus, by relaxing electric field intensity at the boundary portion between the two adjacent side wall surfaces, breakdown voltage of the semiconductor device can be improved.

Preferably in the above-described semiconductor device, the recess has a shape of polygon when viewed in a plan view. Accordingly, cells can be formed at a high degree of integration.

Further, if the recess is formed while using a compound semiconductor composed of two or more elements, the plurality of side wall surfaces of the recess might have planes different in polarities. When the gate electrode is fed with a voltage in the case where the polarities in the plurality of side wall surfaces are different, electric field intensity becomes imbalance in the side wall surfaces to locally form a portion having a low breakdown voltage.

Preferably in the above-described semiconductor device, at least two of the side wall surfaces corresponding to sides of the polygon are formed to include a crystallographically equivalent plane of the compound semiconductor. The crystallographically equivalent plane has the same polarity. Hence, by suppressing the imbalance of electric field intensity in the side wall surfaces when the gate electrode is fed with a voltage, a portion having a low breakdown voltage can be suppressed from being formed locally.

Preferably in the above-described semiconductor device, the recess has a bottom wall surface, and the bottom wall surface and each of the side wall surfaces form an angle larger than 90°. Accordingly, electric field concentration can be relaxed in a boundary portion between the bottom wall surface and the side wall surface of the recess.

Preferably in the above-described semiconductor device, the side wall surface of the recess includes a first plane having a plane orientation of {0-33-8}. Accordingly, channel resistance in the side wall surface can be reduced. Thus, the on-resistance can be reduced.

Preferably in the above-described semiconductor device, the side wall surface of the recess microscopically includes the first plane, and the side wall surface microscopically further includes a second plane having a plane orientation of {0-11-1}. Accordingly, the channel resistance in the side wall surface can be further reduced. Thus, the on-resistance can be further reduced.

Preferably in the above-described semiconductor device, the first plane and the second plane of the side wall surface of the recess includes a combined plane having a plane orientation of {0-11-2}. Accordingly, the channel resistance in the side wall surface can be further reduced. Thus, the on-resistance can be further reduced.

Preferably in the above-described semiconductor device, the side wall surface of the recess macroscopically has an off angle of 62°±10° relative to a {000-1} plane. Accordingly, the channel resistance in the side wall surface can be further reduced. Thus, the on-resistance can be further reduced.

As apparent from the description above, according to the semiconductor device in the present invention, improved breakdown voltage can be achieved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
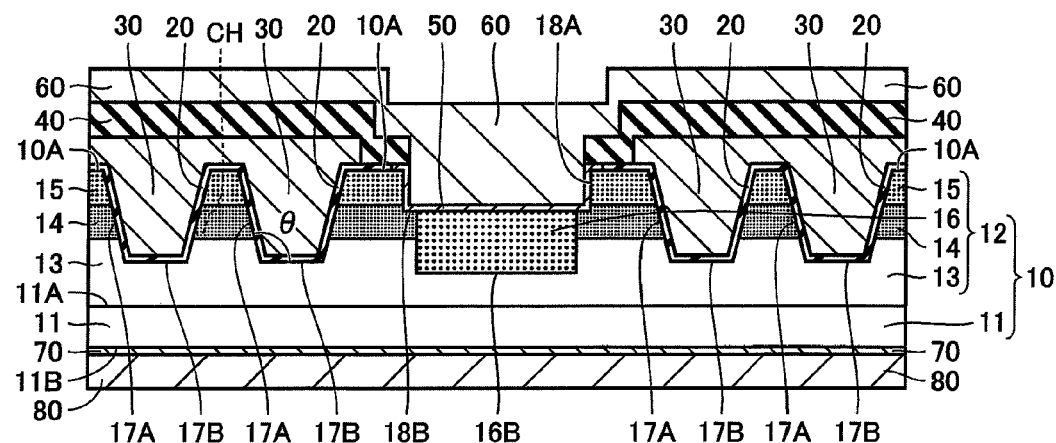
FIG. 1 is a schematic cross sectional view showing a structure of a semiconductor device of one embodiment of the present invention.

The following describes an embodiment of the present invention with reference to figures. It should be noted that in the below-mentioned figures, the same or corresponding portions are given the same reference characters and are not described repeatedly. Further, in the present specification, an individual orientation is represented by [ ], a group orientation is represented by < >, and an individual plane is represented by ( ) and a group plane is represented by { }. In addition, a negative index is supposed to be crystallographically indicated by putting "-" (bar) above a numeral, but is indicated by putting the negative sign before the numeral in the present specification.

Figure 11:
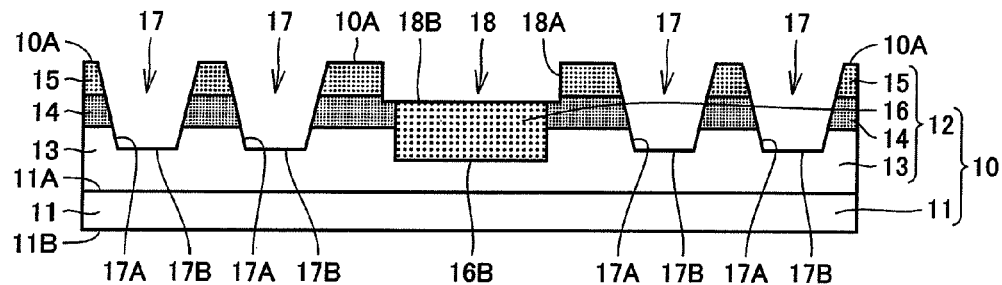
FIG. 11 is a schematic cross sectional view (of a region of FIG. 2 along XI-XI) for illustrating a fifth step of the method for manufacturing the semiconductor device in the embodiment of the present invention.
Figure 12:
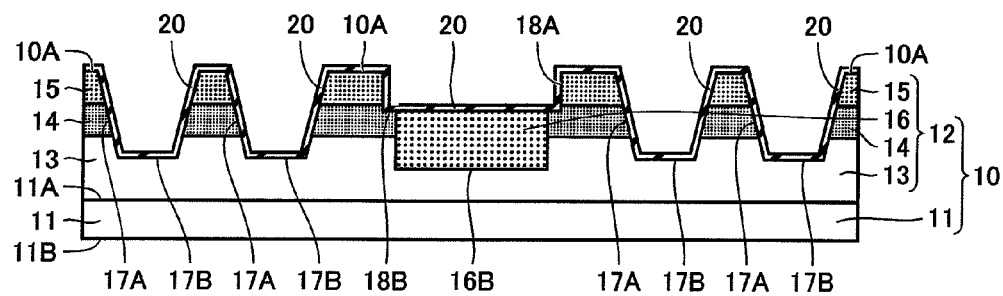
FIG. 12 is a schematic cross sectional view for illustrating a sixth step of the method for manufacturing the semiconductor device in the embodiment of the present invention.
Figure 13:
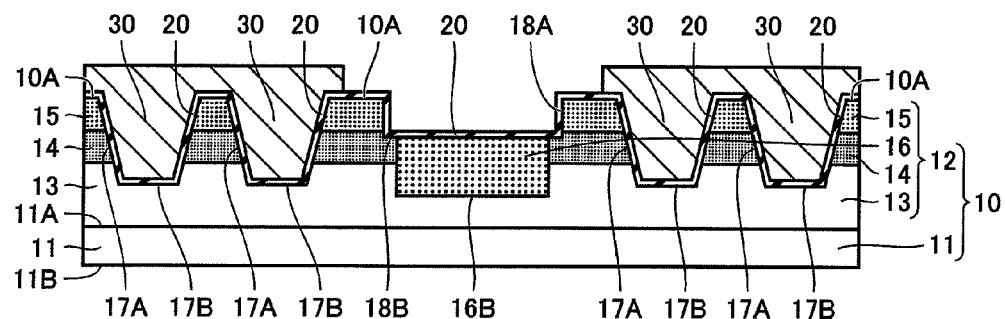
FIG. 13 is a schematic cross sectional view for illustrating a seventh step of the method for manufacturing the semiconductor device in the embodiment of the present invention.
Figure 14:
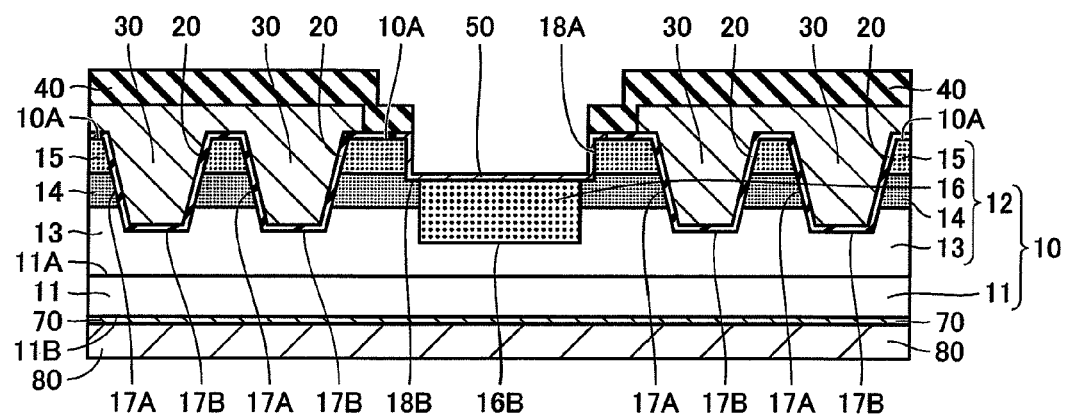
FIG. 14 is a schematic cross sectional view for illustrating an eighth step of the method for manufacturing the semiconductor device in the embodiment of the present invention.

First, one embodiment of the present invention will be described. First, the following describes a structure of a MOSFET 1 serving as a semiconductor device according to the embodiment with reference to FIG. 1. MOSFET 1 includes a substrate 10 made of a compound semiconductor and having a main surface 10A, a gate insulating film 20, a gate electrode 30, an interlayer insulating film 40, an ohmic electrode 50, a source pad electrode 60, a drain electrode 70, and a drain pad electrode 80. Substrate 10 includes a base substrate 11 and a semiconductor layer 12. In semiconductor layer 12, a drift region 13, a body region 14, a source region 15, and a high-concentration second conductivity type region 16 are formed. Further, substrate 10 is provided with a plurality of first recesses 17 (see FIG. 11), each of which opens at the main surface 10A side and has first side wall surfaces 17A and a first bottom wall surface 17B. Further, substrate 10 is provided with a second recess 18 (see FIG. 11), which opens at the main surface 10A side and has second side wall surfaces 18A and a second bottom wall surface 18B.

Base substrate 11 is made of, for example, silicon carbide, contains an n type impurity such as N (nitrogen), and therefore has n type conductivity (first conductivity type). Drift region 13 is formed on a main surface 11A of base substrate 11. As with base substrate 11, drift region 13 contains an n type impurity such as N (nitrogen), and therefore has n type conductivity. The concentration thereof in drift region 13 is lower than that in base substrate 11.

Body region 14 is formed on and in contact with drift region 13 (at a side opposite to the base substrate 11 side). Body region 14 contains a p type impurity such as Al (aluminum) or B (boron), and therefore has p type conductivity (second conductivity type). When viewed in a cross section in the thickness direction of substrate 10 (i.e., in a plane parallel to the plane of sheet of FIG. 1), body region 14 is exposed at first side wall surfaces 17A of first recesses 17, and is disposed to face itself with a first recess 17 interposed therebetween. It should be noted that when viewed from source region 15, body region 14 is disposed at a side opposite to main surface 10A.

Source region 15 is formed on and in contact with body region 14 (at a side opposite to the drift region 13 side). Source region 15 contains an n type impurity such as P (phosphorus), and therefore has n type conductivity (first conductivity type) as with base substrate 11 and drift region 13. Further, the concentration of the n type impurity in source region 15 is higher than that in drift region 13. When viewed in the cross section in the thickness direction of substrate 10, source region 15 is exposed at first side wall surfaces 17A of first recesses 17, and is disposed to face itself with first recess 17 interposed therebetween.

High-concentration second conductivity type region 16 is formed in contact with body region 14 and drift region 13 in semiconductor layer 12 so as to extend to a region deeper than first recess 17. Specifically, high-concentration second conductivity type region 16 is disposed in contact with ohmic electrode 50, extends through body region 14, and has a contact surface (i.e., bottom surface 16B of high-concentration second conductivity type region 16) making contact with drift region 13 and disposed at a location further away from main surface 10A relative to first bottom wall surface 17B of first recess 17. As with body region 14, high-concentration second conductivity type region 16 contains a p type impurity such as Al (aluminum) and therefore has p type conductivity. The concentration thereof in high-concentration second conductivity type region 16 is higher than that in body region 14.

Each of first recesses 17 is formed to extend through source region 15 and body region 14 and reach drift region 13. Specifically, first recess 17 is formed such that first bottom wall surface 17B is disposed closer to ohmic electrode 50 relative to bottom surface 16B of high-concentration second conductivity type region 16. Further, as shown in FIG. 1, first recess 17 is formed such that first side wall surface 17A and first bottom wall surface 17B form an angle θ larger than 90°. In other words, first recess 17 is formed such that first side wall surface 17A and main surface 10A of substrate 10 form an angle larger than 90°.

Second recess 18 is formed to extend through source region 15 and reach body region 14. Specifically, high-concentration second conductivity type region 16 is formed to extend from second bottom wall surface 18B of second recess 18 toward drain electrode 70. Further, as shown in FIG. 1, second side wall surface 18A and second bottom wall surface 18B form an angle of approximately 90°. At second side wall surface 18A of second recess 18, source region 15 is exposed.

Figure 2:
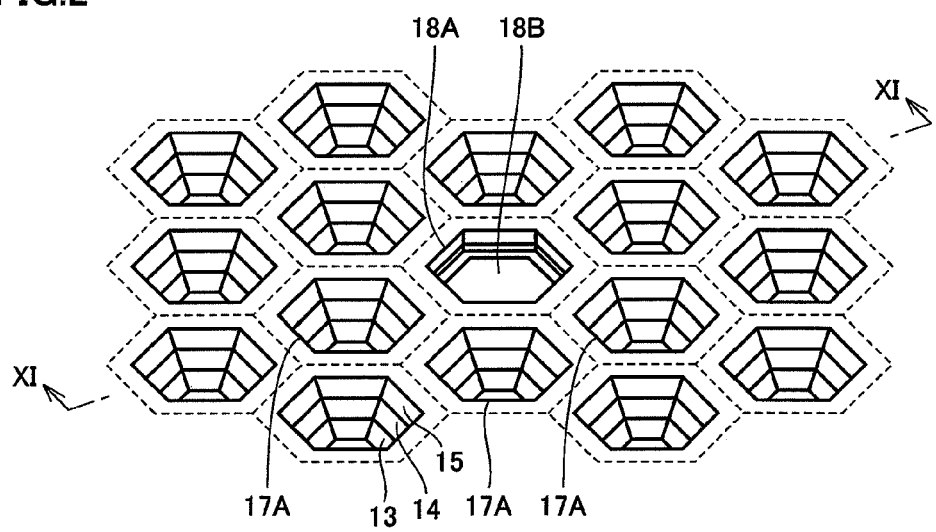
FIG. 2 is a perspective view schematically showing a structure of a substrate of the semiconductor device of the embodiment of the present invention.
Figure 3:
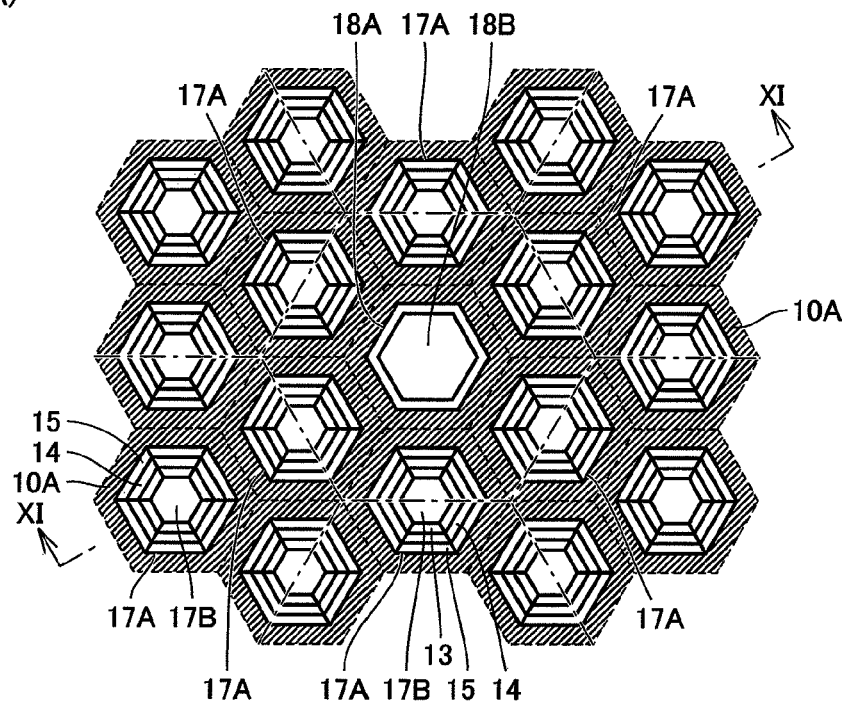
FIG. 3(A) is a plan view schematically showing a structure of a source region of the substrate of the semiconductor device in the embodiment of the present invention.
FIG. 3(B) is a plan view schematically showing structures of cells.
Figure 3:
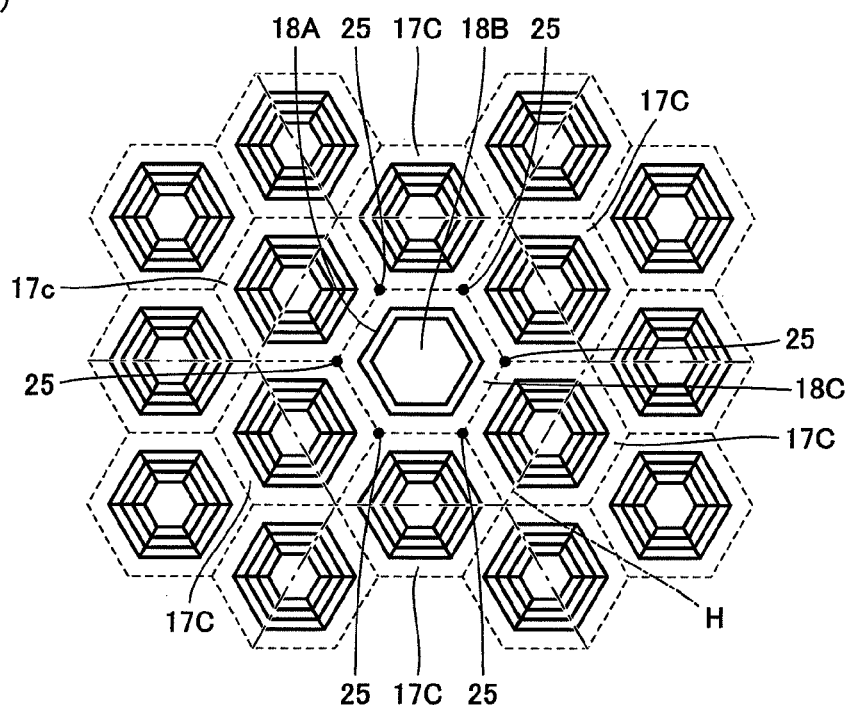

Next, referring to FIG. 2 and FIG. 3, the shapes of first recess 17 and second recess 18 will be described. As shown in FIG. 2 and FIG. 3, each of first recess 17 and second recess 18 has a hexagonal planar shape, for example. At first side wall surface 17A of first recess 17, source region 15, body region 14, and drift region 13 are exposed. At the wall surface of second recess 18, source region 15 is exposed. At second bottom wall surface 18B of second recess 18, body region 14 is exposed.

Referring to FIG. 3(A), a planar structure of source region 15 will be described. Here, FIG. 3(A) and FIG. 3(B) are plan views of the same field of view in a direction perpendicular to main surface 10A of substrate 10. In FIG. 3(A), the exposed portion of source region 15 in main surface 10A is shaded by diagonal lines so as to illustrate the structure of source region 15. FIG. 3(B) is a figure for illustrating structures of cells, and therefore source region 15 is not shaded by the diagonal lines. As shown in FIG. 3(A), when viewed in a plan view, the portions of source region 15 facing each other with first recess 17 interposed therebetween are connected to each other in a region interposed between one certain first recess 17 and another first recess 17 adjacent to this one certain first recess 17. In other words, source region 15 is provided to surround first recesses 17, when viewed in a plan view. Further, body region 14 is formed in contact with source region 15. Hence, when viewed in a plan view, the portions of body region 14 facing each other with first recess 17 interposed therebetween are connected to each other in a region interposed between one certain first recess 17 and another first recess 17 adjacent to this one certain first recess 17. In other words, body region 14 is provided to surround first recesses 17, when viewed in a plan view.

Referring to FIG. 3(B), the structures of the cells will be described. As shown in FIG. 3(B), MOSFET 1 has a cell 18C, which is hypothetically hexagonal by connecting six vertices 25 to one another. Such a hypothetically hexagonal cell 18C has sides in contact with other hexagonal cells 17C. At the central portion of cell 18C, second recess 18 is formed. At the central portion of each cell 17C, first recess 17 is formed. Each of vertices 25 surrounding cell 18C is a point at which each of vertices of two cells 17C overlaps with a vertex of one cell 18C. Referring to FIG. 3(A) and FIG. 3(B), source region 15 is formed to include the vertices of hypothetically hexagonal cell 18C and cells 17C.

Further, the plurality of first recesses 17 are disposed to surround second recess 18. In MOSFET 1 of the embodiment, first recesses 17 are disposed on sides of a hypothetical hexagon H indicated by an alternate long and short dash line so as to surround second recess 18. Further, referring to FIG. 1, gate electrode 30 is formed in first recess 17, and ohmic electrode 50 is formed in second recess 18. Namely, in MOSFET 1 of the embodiment, six cells 17C having gate electrode 30 are formed around one cell 18C having ohmic electrode 50. Assuming that the one cell 18C and the six cells 17C disposed around cell 18C are one unit, MOSFET 1 of the embodiment has such a shape that a plurality of such units are arranged with no space therebetween. It should be noted that cell 18C having ohmic electrode 50 serves as a contact cell for supplying current to source region 15. Each of cells 17C having gate electrode 30 serves as a channel cell for flowing current from source region 15 to drift region 13 via a channel.

Figure 4:
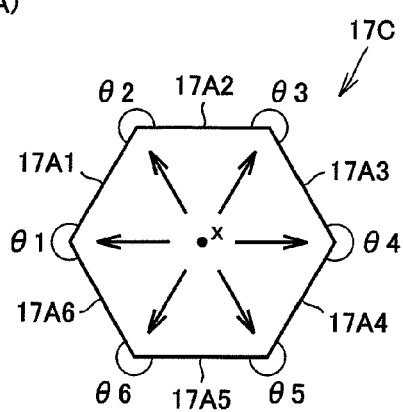
FIG. 4(A) is a plan view schematically showing a shape of a first recess of the semiconductor device of the embodiment of the present invention.
FIG. 4(B) is a perspective view schematically showing the shape of the first recess of the semiconductor device of the embodiment of the present invention.
Figure 4:
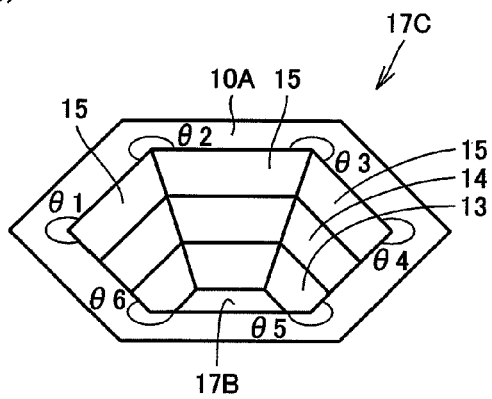
Figure 5:
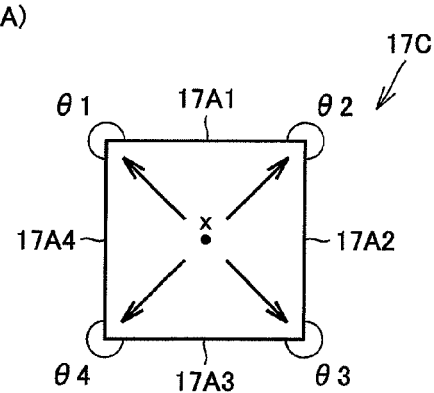
FIG. 5(A) is a plan view schematically showing a shape of a first recess of the semiconductor device of the embodiment of the present invention.
FIG. 5(B) is a perspective view schematically showing the shape of the first recess of the semiconductor device of the embodiment of the present invention.
Figure 5:
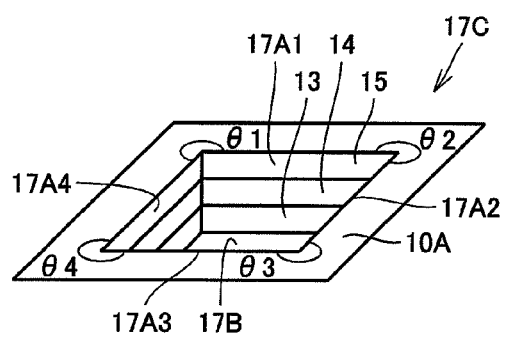

Referring to FIG. 4 and FIG. 5, the shape of the first recess will be described.

As shown in FIG. 4(A) and FIG. 4(B), first recess 17 formed in channel cell 17C has a closed shape when viewed in a plan view. First recess 17 has a shape of hexagon when viewed in a plan view. First recess 17 having such a hexagonal planar shape is formed by six first side wall surfaces 17A1 to 17A6 respectively corresponding to the sides of the hexagon. Angles θ1 to θ6, each of which is formed by two adjacent ones of these six first side wall surfaces (for example, first side wall surface 17A1 and first side wall surface 17A6), is larger than 180°. In the present embodiment, angles θ1 to θ6, each of which is formed by two adjacent first side wall surfaces, are each 240°.

Further, at least two of six first side wall surfaces 17A1 to 17A6 respectively corresponding to the sides of the hexagon are formed to include a crystallographically equivalent plane of the compound semiconductor. Specifically, the above-described at least two first side wall surfaces 17A correspond to a plane inclined in an equivalent crystal orientation relative to a polarization direction of atoms that form the compound semiconductor (for example, c axis direction in the case of silicon carbide).

Further, as shown in FIG. 4(A), when viewed from an arbitrary location x in first recess 17, first side wall surfaces 17A1 to 17A6 provide an outwardly projecting shape in every direction. In other words, an angle between adjacent two first side wall surfaces 17A is smaller than 180° when viewed from arbitrary location x in first recess 17.

As shown in FIG. 5(A) and FIG. 5(B), first recess 17 foamed in channel cell 17C has a shape of quadrangle when viewed in a plan view. First recess 17 having such a quadrangular planar shape is formed by four first side wall surfaces 17A1 to 17A4. Each of angles θ1 to θ4, each of which is formed by two adjacent ones of these four first side wall surfaces (for example, first side wall surface 17A1 and first side wall surface 17A4), is larger than 180°. In the present embodiment, angles θ1 to θ4, each of which is formed by two adjacent first side wall surfaces, are each 270°. Further, as shown in FIG. 5(A), when viewed from an arbitrary location x in first recess 17, first side wall surfaces 17A1 to 17A4 provide an outwardly projecting shape in every direction.

It should be noted that first recess 17 may have any closed shape when viewed in a plan view, such as a triangular shape, a polygonal shape, or a circular shape. It should be also noted that the shape of first recess 17 may be a closed shape formed by connecting a straight line portion and a curve portion to each other when viewed in a plan view. Preferably, first recess 17 has a shape of right hexagon when viewed in a plan view.

Referring to FIG. 1 again, gate insulating film 20 is made of, for example, $SiO_2$ (silicon dioxide), and is disposed on and in contact with first side wall surface 17A and first bottom wall surface 17B of first recess 17 and main surface 10A of substrate 10.

Gate electrode 30 is made of a conductor such as polysilicon having an impurity added therein, and is disposed on and in contact with gate insulating film 20 so as to fill first recess 17.

Interlayer insulating film 40 is made of, for example, $SiO_2$ (silicon dioxide), and is disposed on and in contact with gate electrode 30. Specifically, interlayer insulating film 40 electrically insulates gate electrode 30 from ohmic electrode 50.

Ohmic electrode 50 is formed in contact with main surface 10A of substrate 10, source region 15, body region 14, and high-concentration second conductivity type region 16. Specifically, ohmic electrode 50 is made of a material capable of ohmic contact with source region 15, such as $Ni_xSi_y$ (nickel silicide), $Ti_xSi_y$ (titanium silicide), $Al_xSi_y$ (aluminum silicide), or $Ti_xAl_ySi_z$ (titanium aluminum silicide). Ohmic electrode 50 is electrically connected to source region 15. Further, ohmic electrode 50 is provided on and in contact with second side wall surface 18A and second bottom wall surface 18B of second recess 18.

Drain electrode 70 is formed on and in contact with main surface 11B of base substrate 11 opposite to main surface 11A thereof. Drain electrode 70 is made of, for example, the same material as that of ohmic electrode 50, and is electrically connected to base substrate 11.

Source pad electrode 60 is disposed on and in contact with interlayer insulating film 40 and ohmic electrode 50. Specifically, source pad electrode 60 is made of a conductor such as Al (aluminum), and is electrically connected to source region 15 via ohmic electrode 50.

Drain pad electrode 80 is disposed on and in contact with drain electrode 70. Specifically, as with source pad electrode 60, drain pad electrode 80 is made of a conductor such as Al (aluminum), and is electrically connected to base substrate 11 via drain electrode 70.

The following describes the structure of first side wall surface 17A of first recess 17 of MOSFET 1.

Figure 15:
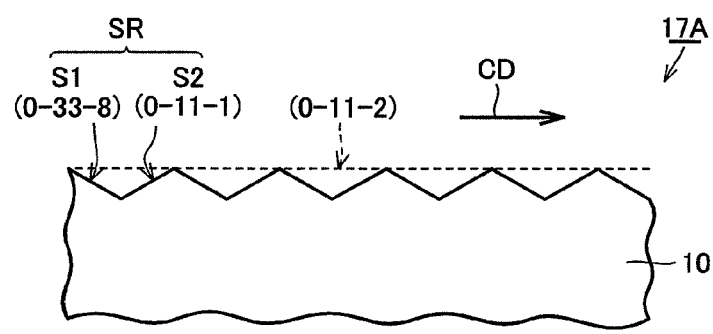
FIG. 15 is a partial cross sectional view schematically showing a fine structure of the substrate in the embodiment of the present invention.

First side wall surface 17A including channel surface CH (see FIG. 1) has a special plane, so that channel surface CH also can have the special plane. As shown in FIG. 15, first side wall surface 17A having the special plane has a plane S1 (first plane). Plane S1 has a plane orientation of {0-33-8}, and preferably has a plane orientation of (0-33-8). Preferably, first side wall surface 17A microscopically includes plane S1. Preferably, first side wall surface 17A further microscopically includes a plane S2 (second plane). Plane S2 has a plane orientation of {0-11-1}, and preferably has a plane orientation of (0-11-1). Here, the term "microscopically" refers to "minutely to such an extent that at least the size about twice as large as an interatomic spacing is considered". As a method for observing such a microscopic structure, for example, a TEM (Transmission Electron Microscope) can be used.

Preferably, first side wall surface 17A has a combined plane SR. Combined plane SR is constituted of periodically repeated planes S1 and S2. Such a periodic structure can be observed by, for example, TEM or AFM (Atomic Force Microscopy). Combined plane SR has a plane orientation of {0-11-2}, and preferably has a plane orientation of (0-11-2). In this case, combined plane SR has an off angle of 62° relative to the {000-1} plane, macroscopically. Here, the term "macroscopically" refers to "disregarding a fine structure having a size of approximately interatomic spacing". For the measurement of such a macroscopic off angle, a method employing general X-ray diffraction can be used, for example. Preferably, in channel surface CH, carriers flow in a channel direction CD, in which the above-described periodic repetition is done.

The following describes detailed structure of combined plane SR.

Figure 16:
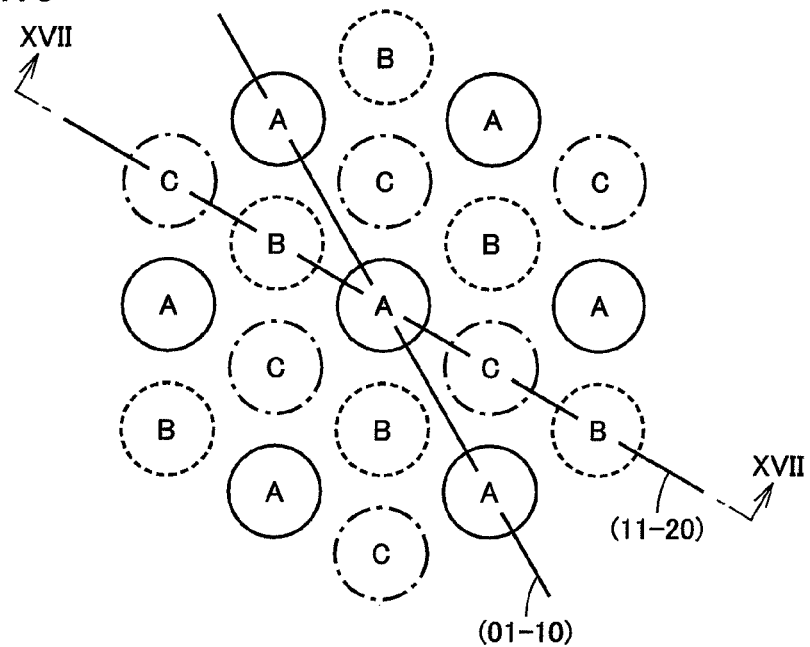
FIG. 16 shows a crystal structure of a (000-1) plane of hexagonal polytype 4H.

Generally, regarding Si atoms (or C atoms), when viewing a silicon carbide single-crystal of polytype 4H from the (000-1) plane, atoms in a layer A (solid line in the figure), atoms in a layer B (broken line in the figure) disposed therebelow, and atoms in a layer C (chain line in the figure) disposed therebelow, and atoms in a layer B (not shown in the figure) disposed therebelow are repeatedly provided as shown in FIG. 16. In other words, with four layers ABCB being regarded as one period, a periodic stacking structure such as ABCBABCBABCB . . . is provided.

Figure 17:
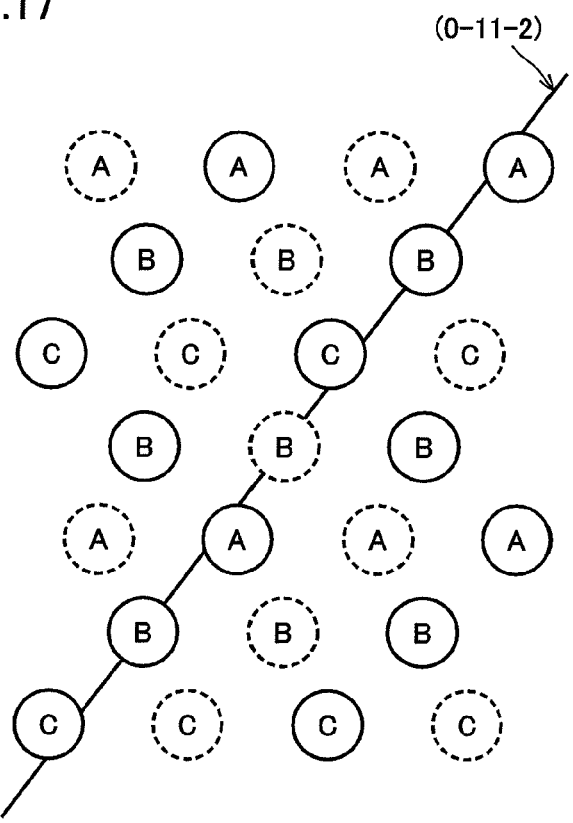
FIG. 17 shows a crystal structure of a (11-20) plane along a line XVII-XVII in FIG. 16.

As shown in FIG. 17, in the (11-20) plane (cross section taken along a line XVII-XVII of FIG. 16), atoms in each of four layers ABCB constituting the above-described one period are not aligned completely along the (0-11-2) plane. In FIG. 17, the (0-11-2) plane is illustrated to pass through the locations of the atoms in layers B. In this case, it is understood that each of atoms in layers A and B is deviated from the (0-11-2) plane. Hence, even when the macroscopic plane orientation of the surface of the silicon carbide single-crystal, i.e., the plane orientation thereof with its atomic level structure being disregarded is limited to (0-11-2), this surface can have various structures microscopically.

Figure 18:
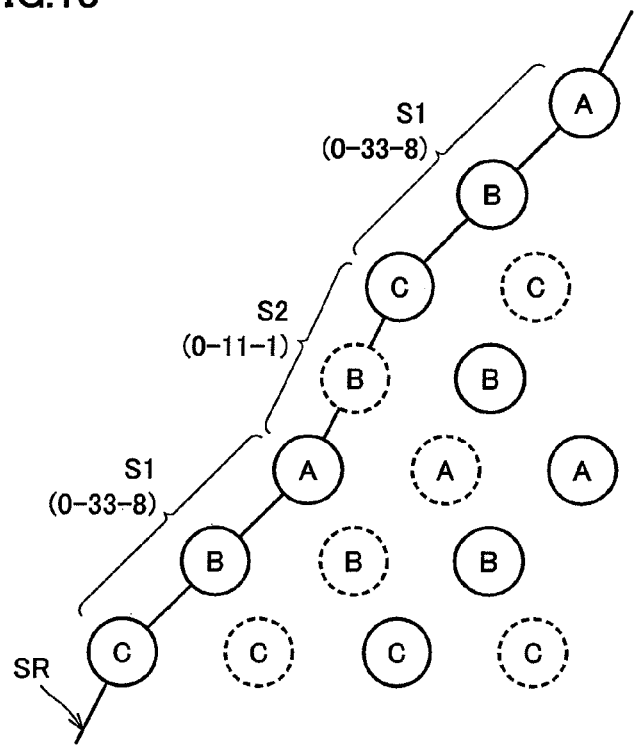
FIG. 18 shows a crystal structure in the vicinity of a surface with the combined plane of FIG. 15 in the (11-20) plane.

As shown in FIG. 18, combined plane SR is constructed by alternately providing planes S1 having a plane orientation of (0-33-8) and planes S2 connected to planes S1 and having a plane orientation different from that of each of planes S1. Each of planes S1 and S2 has a length twice as large as the interatomic spacing of the S1 atoms (or C atoms). It should be noted that a plane with plane S1 and plane S2 being averaged corresponds to the (0-11-2) plane (FIG. 17).

Figure 19:
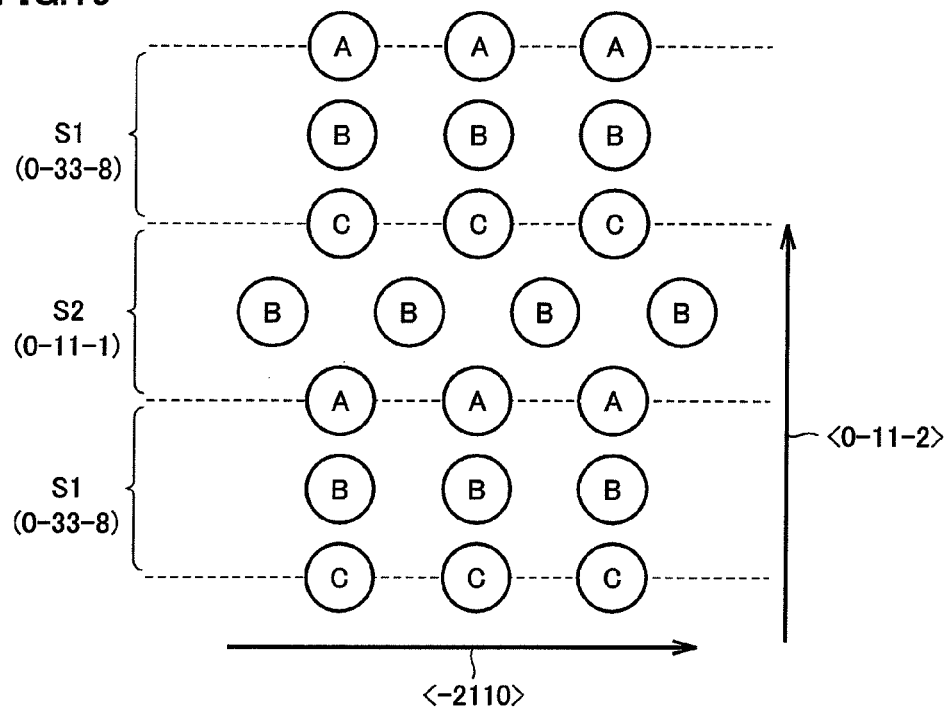
FIG. 19 is a view of the combined plane of FIG. 15 from the (01-10) plane.

As shown in FIG. 19, when viewing combined plane SR from the (01-10) plane, the single-crystal structure has a portion periodically including a structure (plane S1 portion) equivalent to a cubic structure. Specifically, combined plane SR is constructed by alternately providing planes S1 having a plane orientation of (001) in the above-described structure equivalent to the cubic structure and planes S2 connected to planes S1 and having a plane orientation different from that of each of planes S1. Also in a polytype structure other than 4H, the surface can be thus constituted of the planes (planes S1 in FIG. 19) having a plane orientation of (001) in the structure equivalent to the cubic structure and the planes (planes S2 in FIG. 19) connected to the foregoing planes and having a plane orientation different from that of each of the foregoing planes. The polytype may be, for example, 6H or 15R.

Figure 20:
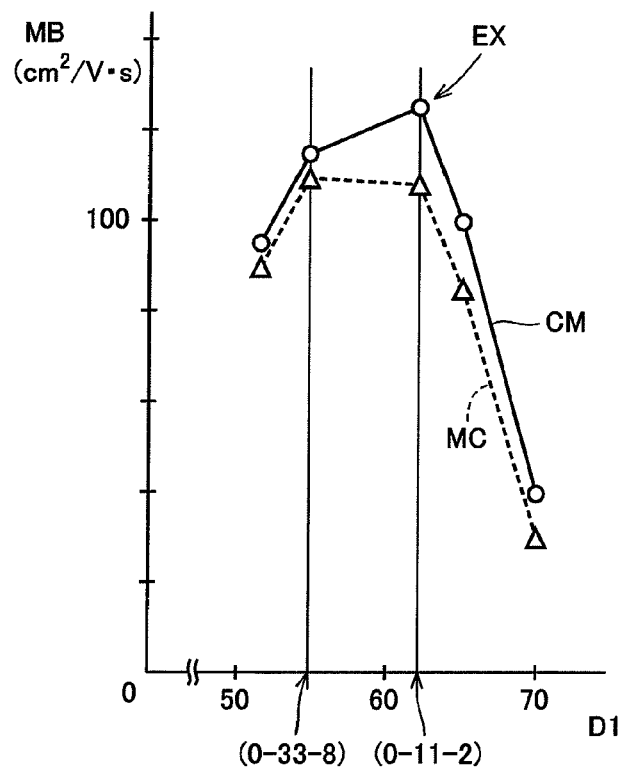
FIG. 20 is a graph showing an exemplary relation between channel mobility and an angle between the channel surface viewed macroscopically and the (000-1) plane in each of a case where thermal etching is performed and a case where no thermal etching is performed.

Referring to FIG. 20, the following describes a relation between the crystal plane of first side wall surface 17A and mobility MB in channel surface CH. In the graph of FIG. 20, the horizontal axis represents an angle D1 fondled by the (000-1) plane and the macroscopic plane orientation of first side wall plane 17A having channel surface CH, whereas the vertical axis represents mobility MB. A group of plots CM correspond to a case where first side wall surface 17A is finished as having the special plane by thermal etching, whereas a group of plots MC correspond to a case where such thermal etching is not performed.

In group of plots MC, mobility MB is at maximum when the surface of channel surface CH has a macroscopic plane orientation of (0-33-8). This is presumably due to the following reason. That is, in the case where the thermal etching is not performed, i.e., in the case where the microscopic structure of the channel surface is not particularly controlled, the macroscopic plane orientation thereof corresponds to (0-33-8), with the result that a ratio of formation of the microscopic plane orientation of (0-33-8), i.e., the plane orientation of (0-33-8) in consideration of that in atomic level becomes statistically high.

On the other hand, mobility MB in group of plots CM is at maximum when the macroscopic plane orientation of the surface of channel surface CH is (0-11-2) (arrow EX). This is presumably due to the following reason. That is, as shown in FIG. 18 and FIG. 19, the multiplicity of planes S1 each having a plane orientation of (0-33-8) are densely and regularly arranged with planes S2 interposed therebetween, whereby a ratio of the microscopic plane orientation of (0-33-8) becomes high in the surface of channel surface CH.

Figure 21:
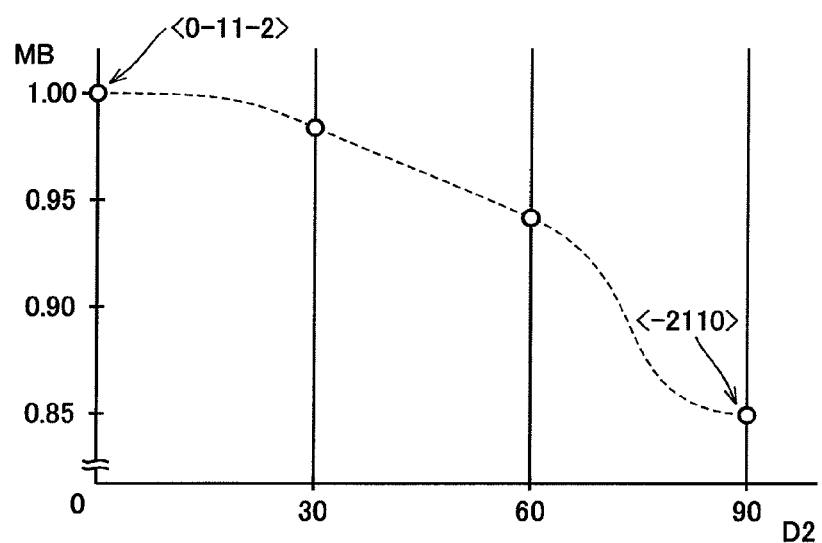
FIG. 21 is a graph showing an exemplary relation between channel mobility and an angle between a channel direction and a <0-11-2> direction.

It should be noted that mobility MB has orientation dependency on combined plane SR. In a graph shown in FIG. 21, the horizontal axis represents an angle D2 between the channel direction and the <0-11-2> direction, whereas the vertical axis represents mobility MB (in any unit) in channel surface CH. A broken line is supplementarily provided therein for viewability of the graph. From this graph, it has been found that in order to increase channel mobility MB, channel direction CD (FIG. 15) preferably has an angle D2 of not less than 0° and not more than 60°, more preferably, substantially 0°.

Figure 22:
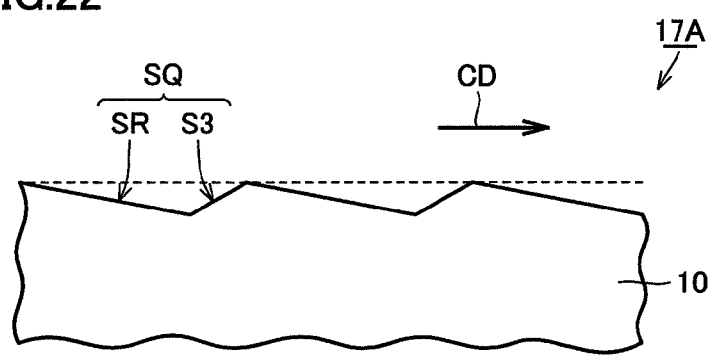
FIG. 22 shows a modification of FIG. 17.

As shown in FIG. 22, first side wall surface 17A may further include a plane S3 (third plane) in addition to combined plane SR. In this case, the off angle of first side wall surface 17A relative to the {000-1} plane is deviated from the ideal off angle of combined plane SR, i.e., 62°. Preferably, this deviation is small, preferably, in a range of ±10°. Examples of a surface included in such an angle range include a surface having a macroscopic plane orientation of the {0-33-8} plane. More preferably, the off angle of first side wall surface 17A relative to the (000-1) plane is deviated from the ideal off angle of combined plane SR, i.e., 62°. Preferably, this deviation is small, preferably, in a range of ±10°. Examples of a surface included in such an angle range include a surface having a macroscopic plane orientation of the (0-33-8) plane.

More specifically, first side wall surface 17A may include a combined plane SQ constituted of periodically repeated plane S3 and combined plane SR. Such a periodic structure can be observed by, for example, TEM or AFM (Atomic Force Microscopy).

The following describes an operation of MOSFET 1 serving as the semiconductor device according to the embodiment of the present invention. Referring to FIG. 1, when a voltage is applied between ohmic electrode 50 and drain electrode 70 while an applied voltage to gate electrode 30 is lower than a threshold voltage, i.e., while it is in OFF state, a pn junction formed between body region 14 and drift region 13 is reverse-biased. Accordingly, MOSFET 1 is in the non-conductive state. Meanwhile, when gate electrode 30 is fed with a voltage equal to or higher than the threshold voltage, carriers are accumulated along first side wall surface 17A of first recess 17 in body region 14 to form an inversion layer. As a result, source region 15 and drift region 13 are electrically connected to each other, whereby current flows between ohmic electrode 50 and drain electrode 70. In the manner described above, MOSFET 1 operates.

Figure 6:
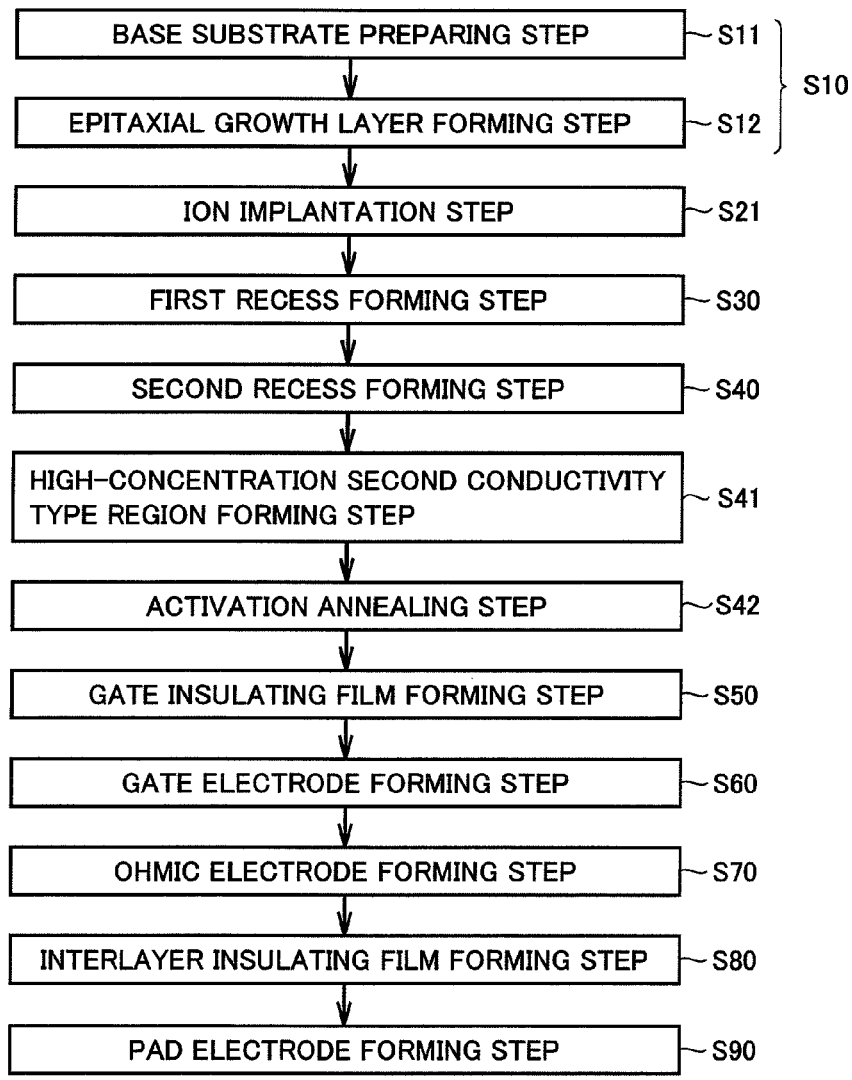
FIG. 6 is a flowchart schematically showing a method for manufacturing the semiconductor device in the embodiment of the present invention.

The following describes a method for manufacturing the semiconductor device in the embodiment of the present invention with reference to FIG. 6 to FIG. 14. In the method for manufacturing the semiconductor device in the embodiment of the present invention, MOSFET 1 serving as the above-described semiconductor device can be manufactured. Referring to FIG. 6, as a step (S 10), a substrate preparing step is first performed. In this step (S10), steps (S11) and (S12) described below are performed to prepare substrate 10 made of silicon carbide.

Figure 7:
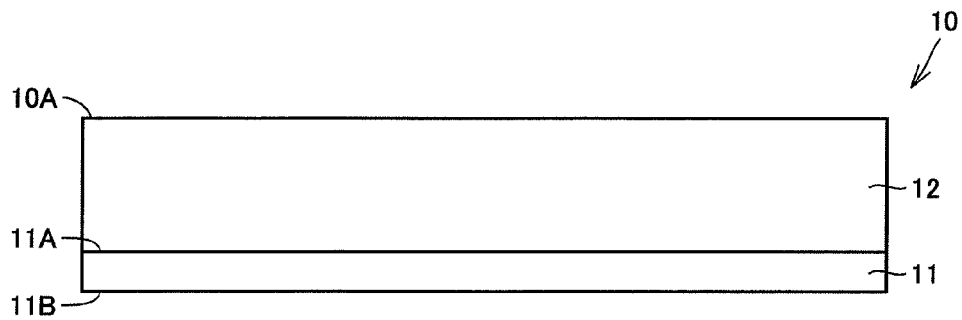
FIG. 7 is a schematic cross sectional view for illustrating a first step of the method for manufacturing the semiconductor device in the embodiment of the present invention.

First, as step (S11), a base substrate preparing step is performed. In this step (S11), an ingot (not shown) made of, for example, 4H—SiC is sliced to prepare base substrate 11 made of silicon carbide as shown in FIG. 7.

Next, as step (S12), an epitaxial growth layer forming step is performed. In this step (S12), referring to FIG. 7, semiconductor layer 12 is formed by epitaxial growth on main surface 11A of base substrate 11. In this way, substrate 10 is prepared which includes base substrate 11 and semiconductor layer 12 and has main surface 10A. It should be noted that each of base substrate 11 and semiconductor layer 12 may be made of any compound semiconductor, and is not limited to silicon carbide. For example, each of base substrate 11 and semiconductor layer 12 may be made of gallium nitride.

Figure 8:
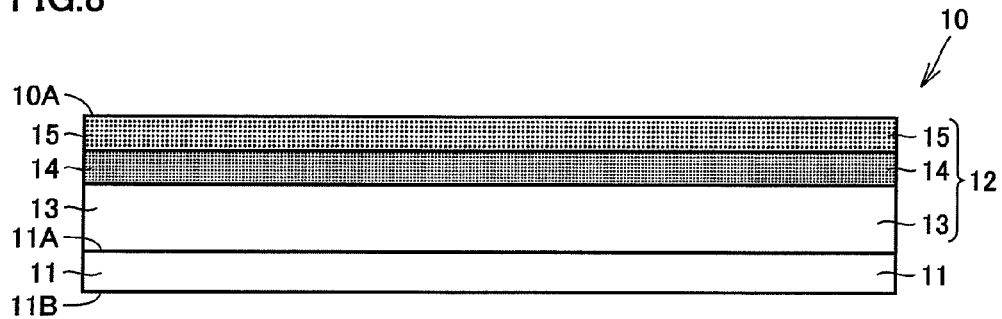
FIG. 8 is a schematic cross sectional view for illustrating a second step of the method for manufacturing the semiconductor device in the embodiment of the present invention.
Figure 9:
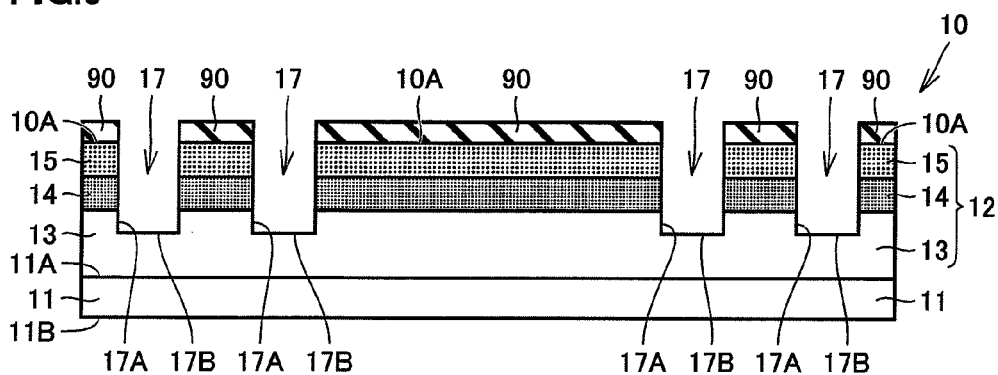
FIG. 9 is a schematic cross sectional view for illustrating a third step of the method for manufacturing the semiconductor device in the embodiment of the present invention.
Figure 10:
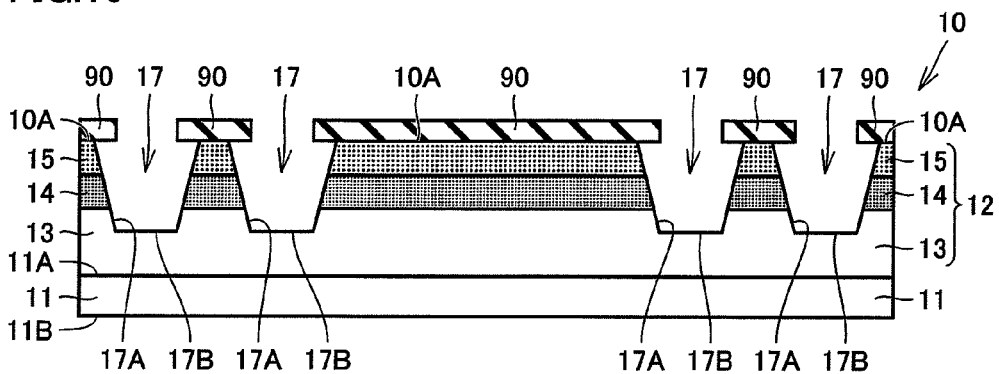
FIG. 10 is a schematic cross sectional view for illustrating a fourth step of the method for manufacturing the semiconductor device in the embodiment of the present invention.

Next, as a step (S21), an ion implantation step is performed. In this step (S21), referring to FIG. 8, for example, Al (aluminum) ions are first implanted into semiconductor layer 12, thereby forming body region 14 of p type conductivity. Next, for example, P (phosphorus) ions are implanted into semiconductor layer 12 at a depth shallower than the depth in which the Al ions have been implanted, thereby forming source region 15 of n type conductivity. Further, in semiconductor layer 12, a region in which none of body region 14 and source region 15 is formed serves as drift region 13. Thus, as shown in FIG. 8, source region 15 of n type including main surface 10A of substrate 10, body region 14 of p type making contact with source region 15, and drift region 13 of n type making contact with body region 14 are formed.

Next, as a step (S30), a first recess forming step is performed. In this step (S30), referring to FIG. 9 and FIG. 10, first recess 17 is formed in substrate 10 so as to open at the main surface 10A side. Specifically, referring to FIG. 9, a mask 90 made of SiO$_2$ (silicon dioxide) is first formed using, for example, a P-CVD (Plasma-Chemical Vapor Deposition) method. Mask 90 has openings in conformity with regions in which first recesses 17 are to be formed in main surface 10A of substrate 10. Next, for example, in an atmosphere containing SF$_6$ (sulfur hexafluoride) gas and oxygen, substrate 10 is etched by means of Inductive Coupled Plasma Reactive Ion Etching (ICP-RIE) or the like. Next, referring to FIG. 10, for example, thermal etching is performed in an atmosphere containing a halogen-based gas, such as chlorine, and oxygen. After completing this etching process, mask 90 is removed. In this way, substrate 10 is provided with first recess 17 having first side wall surface 17A and first bottom wall surface 17B at which source region 15, body region 14, and drift region 13 are exposed.

Next, as a step (S40), a second recess forming step is performed. In this step (S40), referring to FIG. 11, for example, ICP-RIE or the like is employed to etch substrate 10 so as to form second recess 18, which opens at the main surface 10A side and has second side wall surface 18A and second bottom wall surface 18B.

Next, as a step (S41), a high-concentration second conductivity type region forming step is performed. In this step (S41), referring to FIG. 11, for example, Al (aluminum) ions are implanted into a region including second bottom wall surface 18B of second recess 18 in semiconductor layer 12, thereby forming high-concentration second conductivity type region 16 having p type conductivity and extending to a region deeper than first recess 17.

Next, as a step (S42), an activation annealing step is performed. In this step (S42), by heating substrate 10, the impurities implanted in the above-described steps (S21) and (S41) are activated to generate desired carriers in the regions having the impurities implanted therein.

Next, as a step (S50), a gate insulating film forming step is performed. In this step (S50), referring to FIG. 12, for example, by heating substrate 10 in an atmosphere containing oxygen, gate insulating film 20 made of $SiO_2$ (silicon dioxide) is formed on and in contact with main surface 10A of substrate 10, first side wall surface 17A and first bottom wall surface 17B of first recess 17, and second side wall surface 18A and second bottom wall surface 18B of second recess 18.

Next, as a step (S60), a gate electrode forming step is performed. In this step (S60), referring to FIG. 13, for example, a polysilicon film having an impurity added therein is formed using an LP (Low Pressure) CVD method so as to fill first recess 17. In this way, gate electrode 30 is disposed on and in contact with gate insulating film 20.

Next, as a step (S70), an ohmic electrode forming step is performed. In this step (S70), gate insulating film 20 is first removed from the region in which ohmic electrode 50 is to be formed, thereby forming a region at which source region 15, body region 14, and high-concentration second conductivity type region 16 are exposed. Then, in this region, a metal film made of, for example, Ni is formed. Likewise, a metal film made of Ni is formed on main surface 11B of base substrate 11 opposite to main surface 11A. Then, by heating the metal films, at least portions of the metal films are silicided, thereby forming ohmic electrode 50 and drain electrode 70 both electrically connected to substrate 10.

Next, as a step (S80), an interlayer insulating film forming step is performed. In this step (S80), referring to FIG. 14, interlayer insulating film 40 is formed on gate insulating film 20 and gate electrode 30.

Next, as a step (S90), a pad electrode forming step is performed. In this step (S90), referring to FIG. 1, for example, a deposition method is employed to form source pad electrode 60, which is made of a conductor such as Al (aluminum), so as to cover ohmic electrode 50 and interlayer insulating film 40. Further, as with source pad electrode 60, for example, the deposition method is employed to form drain pad electrode 80, which is made of a conductor such as Al (aluminum), on drain electrode 70. By performing steps (S10) to (S90), MOSFET 1 is manufactured, thus completing the method for manufacturing the semiconductor device in the embodiment.

The following describes function and effect of the semiconductor device according to the embodiment of the present invention.

According to MOSFET 1 in the embodiment of the present invention, first recess 17 has a closed shape when viewed in a plan view, and when viewed from an arbitrary location in first recess 17, first side wall surfaces 17A provide an outwardly projecting shape in every direction. Accordingly, an angle between two adjacent ones of first side wall surfaces 17A of first recesses 17 becomes larger than 180°. Thus, by relaxing electric field intensity at a boundary portion between two adjacent first side wall surfaces 17A, breakdown voltage of MOSFET 1 can be improved.

Further, in MOSFET 1 of the embodiment of the present invention, first recess 17 has a shape of hexagon when viewed in a plan view. Accordingly, cells can be formed at a high degree of integration.

Further, in MOSFET 1 of the embodiment of the present invention, at least two of first side wall surfaces 17A corresponding to the sides of the hexagon are formed to include a crystallographically equivalent plane. The crystallographically equivalent plane has the same polarity. Hence, by suppressing imbalance of electric field intensity in first side wall surfaces 17A when gate electrode 30 is fed with a voltage, a portion having a low breakdown voltage can be suppressed from being formed locally.

Preferably in the semiconductor device, first recess 17 has first bottom wall surface 17B, and first bottom wall surface 17B and each first side wall surface 17A form an angle larger than 90°. Accordingly, electric field concentration can be relaxed in a boundary portion between first bottom wall surface 17B and first side wall surface 17A of first recess 17.

Further, in MOSFET 1 of the embodiment of the present invention, first recess 17 has first bottom wall surface 17B, and first bottom wall surface 17B and each first side wall surface 17A form an angle larger than 90°. Accordingly, electric field concentration can be relaxed in a boundary portion between first bottom wall surface 17B and first side wall surface 17A of first recess 17.

Further, in MOSFET 1 of the embodiment of the present invention, first side wall surface 17A of first recess 17 includes first plane S1 having a plane orientation of {0-33-8}. Accordingly, channel resistance in first side wall surface 17A can be reduced. Thus, the on-resistance can be reduced.

Further, in MOSFET 1 of the embodiment of the present invention, first side wall surface 17A of first recess 17 microscopically includes first plane S1, and first side wall surface 17A microscopically further includes second plane S2 having a plane orientation of {0-11-1}. Accordingly, the channel resistance in first side wall surface 17A can be further reduced. Thus, the on-resistance can be further reduced.

Further, in MOSFET 1 of the embodiment of the present invention, first plane S1 and second plane S2 of first side wall surface 17A of first recess 17 include a combined plane having a plane orientation of {0-11-2}. Accordingly, the channel resistance in first side wall surface 17A can be further reduced. Thus, the on-resistance can be further reduced.

Further, in MOSFET 1 of the embodiment of the present invention, first side wall surface 17A of first recess 17 of substrate 10 macroscopically has an off angle of 62°±10° relative to the {000-1} plane. Accordingly, the channel resistance in first side wall surface 17A can be further reduced. Thus, the on-resistance can be further reduced.

The semiconductor device of the present invention is particularly advantageously applicable to a semiconductor device required to allow for high breakdown voltage.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
   a substrate made of a compound semiconductor and having a recess, which opens at one main surface thereof and has side wall surfaces;
   a gate insulating film disposed on and in contact with each of said side wall surfaces; and
   a gate electrode disposed on and in contact with said gate insulating film, said substrate including
      a source region having first conductivity type and disposed to be exposed at said side wall surface, when viewed in a cross section along a thickness direction, and
      a body region having second conductivity type and disposed in contact with said source region at a side opposite to said one main surface so as to be exposed at said side wall surface, when viewed from said source region,
   said recess having a closed shape when viewed in a plan view,
   said side wall surfaces providing an outwardly projecting shape in every direction when viewed from an arbitrary location in said recess,
   wherein said side wall surface of said recess includes a first plane having a plane orientation of {0-33-8},
   wherein said side wall surface of said recess microscopically includes said first plane, and said side wall surface microscopically further includes a second plane having a plane orientation of {0-11-1}, and
   wherein said first plane and said second plane of said side wall surface of said recess includes a combined plane having a plane orientation of {0-11-2}.

2. The semiconductor device according to claim 1, wherein said recess has a shape of polygon when viewed in a plan view.

3. The semiconductor device according to claim 2, wherein at least two of said side wall surfaces corresponding to sides of said polygon are formed to include a crystallographically equivalent plane of said compound semiconductor.

4. The semiconductor device according to claim 1, wherein said recess has a bottom wall surface, and said bottom wall surface and each of said side wall surfaces form an angle larger than 90°.

5. The semiconductor device according to claim 1, wherein said side wall surface of said recess macroscopically has an off angle of 62° ±10° relative to a {000-1} plane.

* * * * *